(12) United States Patent
Kim et al.

(10) Patent No.: US 7,394,127 B2
(45) Date of Patent: Jul. 1, 2008

(54) NON-VOLATILE MEMORY DEVICE HAVING A CHARGE STORAGE OXIDE LAYER AND OPERATION THEREOF

(75) Inventors: Ki-Chul Kim, Suwon-si (KR); Geum-Jong Bae, Incheon-si (KR); Byoung-jin Lee, Seoul (KR); Sang-Su Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/047,764

(22) Filed: Feb. 2, 2005

(65) Prior Publication Data

US 2005/0184334 A1    Aug. 25, 2005

(30) Foreign Application Priority Data

Feb. 20, 2004    (KR) .................. 10-2004-0011575

(51) Int. Cl.
*H01L 29/788* (2006.01)
(52) U.S. Cl. .............. 257/321; 257/322; 257/323; 257/324; 257/298; 257/E21.679
(58) Field of Classification Search .......... 257/324, 257/315, 316, 317, 321, 322, 333, 298, E21.679; 438/216, 261, 591
See application file for complete search history.

(56) References Cited

U.S. PATENT DOCUMENTS

| | | | | |
|---|---|---|---|---|
| 5,930,631 A | 7/1999 | Wang et al. | ........... | 438/286 |
| 6,287,917 B1* | 9/2001 | Park et al. | ........... | 438/262 |
| 6,461,905 B1 | 10/2002 | Wang et al. | | |
| 6,507,066 B1* | 1/2003 | Hsu et al. | ........... | 257/314 |
| 6,617,639 B1 | 9/2003 | Wang et al. | ........... | 257/324 |
| 6,784,476 B2 | 8/2004 | Kim et al. | | |
| 2004/0070030 A1* | 4/2004 | Chindalore et al. | ........ | 257/336 |
| 2005/0153508 A1* | 7/2005 | Lingunis et al. | ........... | 438/257 |

FOREIGN PATENT DOCUMENTS

| | | |
|---|---|---|
| JP | 53-069590 | 6/1978 |
| KR | 000067424 | 11/2000 |
| KR | 10-2002-0064016 | 8/2002 |

OTHER PUBLICATIONS

T. Y. Chan, et al. A True Single-Transistor Oxide-Nitride-Oxide EEPROM Device, Mar. 1987, IEEE Electron Device Letters., vol. 8, No. 3, pp. 93-95.

* cited by examiner

*Primary Examiner*—Evan Pert
*Assistant Examiner*—Tan Tran
(74) *Attorney, Agent, or Firm*—Lee & Morse, P.C.

(57) ABSTRACT

A non-volatile memory device includes a pair of source/drain regions disposed in a semiconductor substrate, having a channel region between them. A charge storage oxide layer is disposed on the channel region and overlaps part of each of the pair of source/drain regions. A gate electrode is disposed on the charge storage oxide layer. At least one halo implantation region is formed in the semiconductor substrate adjacent to one of the pair of source/drain regions, and overlapping the charge storage oxide layer. A program operation is performed by trapping electrons in the charge storage oxide layer located near the source/drain region where the halo ion implantation region is formed, and an erase operation is performed by injecting holes into the charge storage oxide layer located near the source/drain region where the halo ion implantation region is formed.

20 Claims, 5 Drawing Sheets

NON-VOLATILE MEMORY DEVICE HAVING A CHARGE STORAGE OXIDE LAYER AND OPERATION THEREOF

BACKGROUND

1. Field of the Invention

The present invention relates to a non-volatile memory device. More particularly, the present invention relates to a non-volatile memory device having a charge storage oxide layer and operation thereof.

2. Description of Related Art

In contrast to a volatile memory device, a non-volatile memory device retains data stored in its memory cells even with supplied power turned off. A volatile memory device, e.g., a dynamic random access memory (DRAM), needs a refresh operation to retain data, resulting in high power consumption. In contrast, a non-volatile memory device, e.g., a flash memory/electrical erasable programmable read only memory (EEPROM), has a large capacity, low power consumption, and typically used for a file system, a memory card, a portable appliance, etc.

Generally, non-volatile memory devices are classified into a floating gate type memory device and a floating trap type memory device, depending on the material of a charge storage layer. The floating trap type memory device uses a silicon nitride layer as a charge storage layer, and is classified into a silicon/oxide/nitride/oxide/silicon (SONOS) memory device and a metal/oxide/nitride/oxide/silicon (MONOS) memory device, depending on the material of a gate electrode. Further, depending on its structure, non-volatile memory devices may be classified into a stack gate type, a split gate type, a notched gate type, a nano dot type, etc.

Since the floating gate type memory device uses a conductive floating gate as a charge storage layer, if a defect occurs on a part of a tunnel oxide layer separating the floating gate and a semiconductor substrate, all charges stored in the floating gate may be lost. In order to prevent this loss, and to improve reliability, the floating gate type memory device requires a tunnel oxide layer which is thick relative to that of the floating trap type memory device. As the thickness of the tunnel oxide layer is increased, a high operation voltage is needed, thus requiring complicated peripheral circuits. Thus, use of floating gate type memory devices limits integration of a semiconductor device, and has problems caused by high power consumption.

In the floating trap type memory device, since charges are stored in a deep level trap, a tunnel oxide layer that is thin relative to that of the floating gate type memory device may be used, allowing use of a low operation voltage. However, the floating trap type memory device needs a tunnel oxide layer and a blocking oxide layer to encompass a silicon nitride layer used as a charge storage layer, in order to inject and store charges. To achieve high integration of a semiconductor memory device, a simplified memory cell structure is needed. In the conventional floating trap type memory device, an oxide layer may replace a silicon nitride layer as a charge storage layer, allowing the tunnel oxide layer and the blocking oxide layer to be omitted. This replacement has thus been of interest.

However, even when non-volatile memory devices employ the oxide layer as the charge storage layer, much work is still needed to improve general characteristics of the memory device, e.g., program and erase efficiencies.

SUMMARY OF THE INVENTION

The present invention is therefore directed to a non-volatile memory device and operation thereof, which substantially overcome one or more of the problems due to the limitations and disadvantages of the related art.

It is a feature of an embodiment of the present invention to provide a non-volatile memory device having a simplified memory cell.

It is another feature of an embodiment of the present invention to provide a non-volatile memory device having a simplified formation processes, thereby improving productivity.

It is yet another feature of an embodiment of the present invention to provide a non-volatile memory device having improved program and erase efficiencies during operation thereof.

At least one of the above and other features and advantages of the present invention may be realized by providing non-volatile memory device, including a semiconductor substrate, a pair of source/drain regions in the semiconductor substrate, a channel region between the pair of source/drain regions, a charge storage oxide layer on the channel region, the charge storage oxide layer overlapping a part of each of the source/drain regions, a gate electrode disposed on the charge storage oxide layer, and at least one halo ion implantation region in the semiconductor substrate adjacent to one of the pair of source/drain regions, the at least one halo ion implantation region overlapping the charge storage oxide layer.

The charge storage oxide layer may be selected from the group consisting of a silicon oxide ($SiO_2$) layer, a silicon oxynitride (SiON) layer, an aluminum oxide ($Al_2O_3$) layer, a zirconium oxide ($ZrO_2$) layer, a hafnium oxide ($HfO_2$) layer, a lanthanum oxide ($La_2O_5$) layer, and a stacked layer thereof. The charge storage oxide layer may be a stacked layer of a thermal oxide layer and an MTO layer, which is heat treated in the $N_2O$ atmosphere. The charge storage oxide layer may be a stacked layer of a thermal oxide layer, a silicon oxynitride layer, an MTO layer, a silicon oxynitride layer, and an MTO layer, which is heat treated in the $N_2O$ atmosphere.

The pair of source/drain regions may be of a first conductivity type and the halo ion implantation region may be of a second conductivity type, the first and second conductivity types being different from each other. The source/drain regions may be diffusion regions of N-type impurity ions, and the halo ion implantation region may be a diffusion region of P-type impurity ions.

The non-volatile memory device may include a main gate insulating layer and a main gate electrode, which are sequentially stacked on the channel region, and spaced apart from the source/drain regions, and sidewall gate electrodes disposed on both sidewalls of the main gate electrode to overlap a part of each of the source/drain regions, wherein the charge storage oxide layer is continuously interposed between the main gate electrode and the sidewall gate electrodes, and between the sidewall gate electrodes and the semiconductor substrate. The main gate electrode and the sidewall gate electrode are electrically connected to each other.

At least one of the above and other features and advantages of the present invention may be realized by providing a method of operating the non-volatile memory device including trapping electrons in the charge storage oxide layer located near the source/drain regions where the at least one halo ion implantation region is formed to program the non-volatile memory device; and injecting holes into the charge storage oxide layer located near the source/drain regions where the at least one halo ion implantation region is formed to erase the non-volatile memory device.

The at least one halo ion implantation region may include first and second halo ion implantation regions, each first and second halo ion implantation region being in the semiconductor substrate adjacent to a respective one of the pair of source/drain regions and overlapping the charge storage oxide layer.

Two bits of information may be programmed by trapping electrons in the charge storage oxide layer near each of the source/drain regions, respectively. Injecting holes may include applying a negative voltage to the gate electrode and applying a positive voltage to each of the source/drain regions, respectively.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2004-11575, filed on Feb. 20, 2004, in the Korean Intellectual Property Office, and entitled: "Non-Volatile Memory Device Having Charge Storage Oxide Layer," is incorporated by reference herein in its entirety.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout the specification.

Figure 1A:
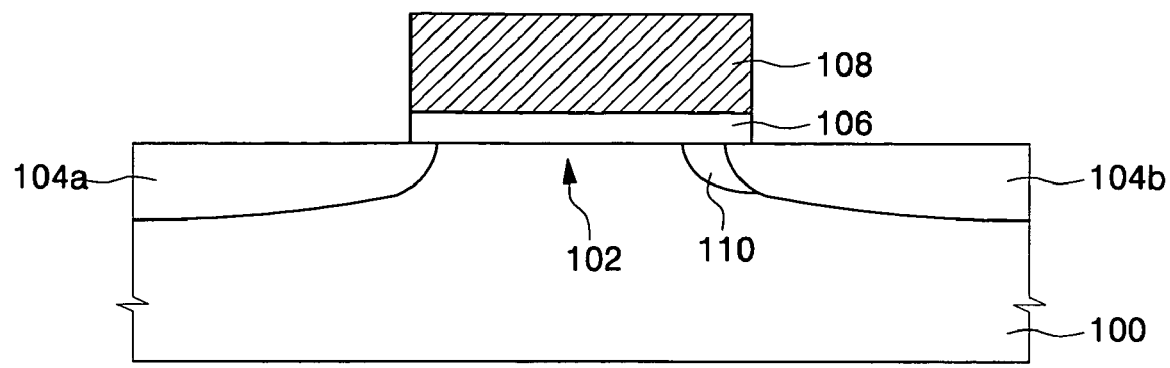
FIGS. 1A and 1B illustrate cross-sectional views of a non-volatile memory device according to a first embodiment of the present invention.
Figure 1B:
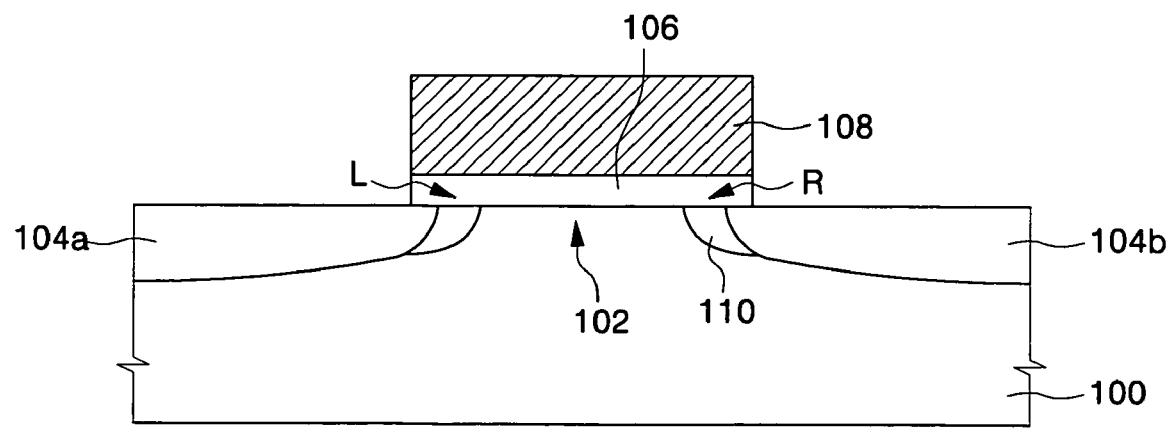

FIGS. 1A and 1B illustrate cross-sectional views of a non-volatile memory device according to a first embodiment of the present invention.

Referring to FIGS. 1A and 1B, a pair of source/drain regions 104$a$, 104$b$, which are spaced apart from each other by a channel region 102, are disposed in a semiconductor substrate 100 having a first conductivity. The source/drain regions 104$a$, 104$b$ are diffusion regions of impurity ions having a second conductivity. A charge storage oxide layer 106 is disposed on the channel region 102. The charge storage oxide layer 106 overlaps a part of the source/drain regions 104$a$, 104$b$.

The charge storage oxide layer 106 may be formed of one layer selected from the group consisting of a silicon oxide ($SiO_2$) layer, a silicon oxynitride (SiON) layer, an aluminum oxide ($Al_2O_3$) layer, a zirconium oxide ($ZrO_2$) layer, a hafnium oxide ($HfO_2$) layer, a lanthanum oxide ($La_2O_5$) layer, and a stacked layer including any combination thereof. The charge storage oxide layer 106 may be an oxide layer, which is formed by depositing, for example, a medium temperature oxide (MTO) layer on the semiconductor substrate, and heat treating in the presence of nitrous oxide ($N_2O$). The charge storage oxide layer 106 may be formed of a single layer, but may be formed of layers in stack in order to improve a charge trap characteristic and a data retention characteristic, i.e., a bake retention characteristic. In this case, the charge storage oxide layer 106 may be a stacked layer of a thermal oxide layer and an MTO layer, which is heat treated in the presence of $N_2O$. Alternatively, the charge storage layer 106 may be a stacked layer of a thermal oxide layer, a silicon oxynitride layer, an MTO layer, a silicon oxynitride layer, and an MTO layer, which is heat treated in the presence of $N_2O$.

Conventional non-volatile memory devices that include a nitride layer as a charge storage layer also include a tunnel oxide layer and a blocking oxide layer above and under the nitride layer, respectively. In contrast, the non-volatile memory device according to the present invention does not include a tunnel oxide layer or a blocking oxide layer, thereby simplifying a structure and involved processing steps. Furthermore, logic elements may be readily embedded within the device.

Still referring to FIGS. 1A and 1B, a gate electrode 108 is then, disposed on the charge storage oxide layer 106. The gate electrode 108 may be formed of poly silicon. At least one halo ion implantation region 110 is formed in the semiconductor substrate adjacent to the source/drain regions 104$a$, 104$b$, to overlap the charge storage oxide layer 106. The halo ion implantation region 110 is a diffusion region of impurity ions having a first conductivity. For example, if the semiconductor substrate 100 is a P-type, and the source/drain regions 104$a$, 104$b$ are diffusion regions of N-type impurity ions, the halo ion implantation region 110 is a diffusion region of P-type impurity ions.

The halo ion implantation region 110 is formed to increase program and erase efficiencies. An impurity concentration of the halo ion implantation region 110, which has the same conductivity as the semiconductor substrate 100, may be relatively high compared to that of the semiconductor substrate 100. The halo ion implantation region 110 can suppress a short channel effect. In other words, the presence of the halo ion implantation region 110 locally increases a threshold voltage, thereby preventing punch-through. Further, the generation of hot electrons during programming can be optimized by the halo ion implantation region 110. An electric field is intensely generated around the charge storage oxide layer adjacent to the source/drain regions 104a, 104b by the halo ion implantation region 110, thereby improving program efficiency.

Referring to FIGS. 1A and 1B, formation of the non-volatile memory device shown in the drawings will be discussed below. An oxide layer and a conductive layer are sequentially formed on the semiconductor substrate 100 having a first conductivity. The oxide layer may be formed using a chemical vapor deposition (CVD) method or an atomic layer deposition (ALD) method. Then, the oxide layer and the conductive layer are sequentially patterned to form a charge storage oxide layer 106 and a gate electrode 108, which are sequentially stacked on the semiconductor substrate. Source/drain regions 104a, 104b may be formed by injecting a impurity ions having a second conductivity into the semiconductor substrate 100, using the gate electrode 108 as an ion implantation mask.

Then, at least one halo ion implantation region 110 is formed in the semiconductor substrate 100 near one or both sides of the gate electrode 108 in contact with the source/drain regions 104a, 104b. The halo ion implantation region 110 is formed with the same conductivity as the semiconductor substrate 100. For example, if the semiconductor substrate 100 is a P-type, boron (B) or a boron fluoride (BF) may be injected to form the halo ion implantation region 110. Further, during the ion injection for the halo ion implantation region 110, it is preferable for the gate electrode 108 not to block the ion injection. Thus, ions for the halo ion implantation region 110 may be injected at a tilt, e.g., at an angle from about 0° to 45°, with respect to the surface of the semiconductor substrate 100. The impurity ions may be injected with energies of several KeV to hundreds of KeV, and, more specifically, the impurity ions may be injected with energies of about 5 KeV to 200 KeV. Further, in the embodiments of the present invention, the halo ion implantation region 110 is preferably formed in the semiconductor substrate 100 at a region where program and erase are performed, i.e., under a portion of the charge storage oxide layer 106 where charges are trapped. As shown in FIG. 1A, the halo ion implantation region 110 may be formed near a region which functions as a drain region of the source/drain regions 104a, 104b, allowing one bit of information per cell to be programmed. As shown in FIG. 1B, the halo ion implantation region 110 may be formed near each region of the source/drain regions 104a, 104b, allowing two bits of information per cell to be programmed.

Program/erase/read of the non-volatile memory device according to the first embodiment of the present invention may be performed as follows. For the convenience of explanation, a left region of the source/drain regions 104a, 104b of FIGS. 1A and 1B will be referred to as a first diffusion region 104a, and a right region thereof will be referred to as a second diffusion region 104b.

Programming of the non-volatile memory device according to the first embodiment of the present invention may use channel hot electron injection (CHEI), which generates a potential between the source and the drain. A channel is formed by the lateral electric field generated thereby. Electrons are moved along the channel from the source to the drain. When the electrons are moved along the channel, they are provided with energy. Thus, hot electrons, which have achieved energy sufficient to overcome a barrier between the semiconductor substrate 100 and the charge storage oxide layer 106, are trapped inside the charge storage layer oxide 106. The likelihood that hot electrons are so injected is highest around the drain, in which the electrons can achieve the highest energy. When the electrons are injected into the charge storage oxide layer 106, a threshold voltage is increased.

One or two bits per non-volatile memory cell may be programmed. For example, if one bit per non-volatile memory cell is to be programmed, as shown in FIG. 1A, positive voltages $V_g$ and $V_d$ are applied to the gate electrode 108 and the second diffusion region 104b, which functions as a drain, respectively. At this time, the first diffusion region 104a, which functions as a source, is grounded or receives a voltage $V_s$ less than the voltage $V_d$ applied to the second diffusion region 104b. As a result, hot electrons are trapped from the channel region 102 into the charge storage oxide layer 106 near the second diffusion region 104b. Since the halo ion implantation region 110 is formed near the second diffusion region 104b, program efficiency is improved.

If two bits per non-volatile memory cell are to be programmed, as shown in FIG. 1B, electrons may be injected into bit regions L, R, which are located on the left and the right of the charge storage oxide layer 106 adjacent to the diffusion regions 104a, 104b, respectively, using CHEI. Each region defines one bit. When the left bit region L is programmed, the first diffusion region 104a functions as a drain, and the second diffusion region 104b functions as a source. In contrast, when the right bit region R is programmed, the first diffusion region 104a functions as a source, and the second diffusion region 104b functions as a drain. In either case, since the halo ion implantation region 110 is formed near both the first diffusion region 104a and the second diffusion region 104b respectively, program efficiency is improved.

Further, an erase of the non-volatile memory device according to the embodiment of the present invention uses hot hole injection (HHI). Referring to FIG. 1A, if one bit per non-volatile memory cell is to be erased, the erase is performed by applying a negative voltage $V_g$ to the gate electrode. At this time, a positive voltage $V_d$ is applied to the second diffusion region 104b, which functions as a drain, and the first diffusion region 104a, which functions as a source, is maintained in a floating state.

Further, referring to FIG. 1B, if two bits per non-volatile memory cell are to be erased, the erase is performed by applying a negative voltage $V_g$ to the gate electrode, and applying positive voltages to the two diffusion regions 104a, 104b. At this time, the application of the positive voltages to the two diffusion regions 104a, 104b may be done sequentially. Since the halo ion implantation region 110 is formed near both the first diffusion region 104a and the second diffusion region 104b, respectively, erase efficiency is improved.

Now hereinafter, a read method will be described. The reading of the non-volatile memory cell is similar to the programming described above.

However, a voltage applied to the gate electrode is lower than for the reading than for the programming. A threshold voltage of the programmed non-volatile memory device is increased. Thus, if a voltage lower than the increased threshold voltage is applied, an electric current does not flow, indicating the non-volatile memory cell has been programmed.

For example, as shown in FIG. 1A, when reading one bit per non-volatile memory cell, a read voltage less than the program voltage is applied to the gate electrode 108 during the reading. If the non-volatile memory cell has been programmed, since a threshold voltage is increased, the non-volatile memory device is turned off, and thus, an electric current does not flow. In contrast, when the non-volatile memory device is not programmed, it has a relatively low threshold voltage, is turned on by the read voltage, and, thus, an electric current flows. A read direction may be opposite the program direction.

When reading two bits per non-volatile memory cell, as shown in FIG. 1B, each read direction may be opposite to the program direction. In other words, when reading information stored in the left bit region L, the first diffusion region 104a functions as a source, and the second diffusion region 104b functions as a drain. When reading information stored in the right bit region R, this may be reversed, i.e., the first diffusion region 104a functions as a drain and the second diffusion region 104b functions as a source.

Figure 2:
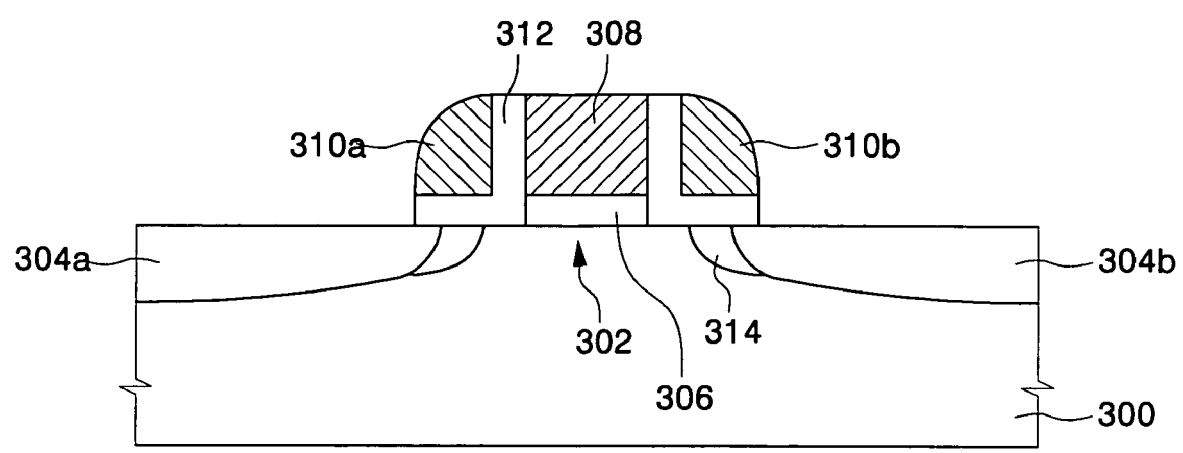
FIG. 2 illustrates a cross-sectional view of a non-volatile memory device according to a second embodiment of the present invention.

FIG. 2 illustrates a cross-sectional view of a non-volatile memory device according to a second embodiment of the present invention.

Referring to FIG. 2, a pair of source/drain regions 304a, 304b, which are spaced apart from each other by a channel region 302, are disposed in a semiconductor substrate 300 having a first conductivity. The pair of source/drain regions 304a, 304b have a second conductivity. A main gate insulating layer 306 and a main gate electrode 308 are sequentially stacked on the channel region 302, and spaced apart from the pair of the source/drain regions 304a, 304b. The main gate insulating layer 306 may be a thermal oxide layer. Further, the main gate electrode 308 may be formed of poly silicon. Sidewall gate electrodes 310a, 310b are disposed on both sidewalls of the main gate electrode 308, and overlap a part of the source/drain regions 304a, 304b. The sidewall gate electrodes 310a, 310b may be poly silicon. Charge storage oxide layers 312 are continuously interposed between the main gate electrode 308 and each of the sidewall gate electrodes 310a, 310b, and between each of the sidewall gate electrodes 310a, 310b and the semiconductor substrate 300. Further, even though not depicted in the drawing, the main gate electrode 308 and the sidewall gate electrodes 310a, 310b may be electrically connected to each other by a conductive layer, which is sequentially formed on the main gate electrode 308 and the sidewall gate electrodes 310a, 310b. The conductive layer may be a metal silicide layer or a contact structure formed in an interlayer insulating layer. The charge storage oxide layers 312 may be an oxide layer or stacked oxide layers, as in the first embodiment of the present invention. At least one halo ion implantation region 314 is disposed in the semiconductor substrate 300 adjacent to the source/drain regions 304a, 304b, and overlaps one of the charge storage oxide layers 312. The halo ion implantation region 314 is a diffusion region of impurity ions having a first conductivity. The halo ion implantation region 314 may be formed in the semiconductor substrate, at a region where program and erase are performed, i.e., under a portion of the charge storage oxide layer 312, where charges are trapped. In other words, the halo ion implantation region 314 may be formed near the one of the source/drain regions 304a, 304b, which functions as a drain, allowing one bit of information per cell to be programmed. As shown in FIG. 2, the halo ion implantation region 314 may be formed near both the source/drain regions 304a, 304b, respectively, allowing two bits of information per cell to be programmed.

Program/erase/read methods of the non-volatile memory device according to a second embodiment of the present invention are the same as the first embodiment. That is, using CHEI during programming, either one of the source/drain regions 304a, 304b, in which the halo ion implantation region 314 is formed, functions as a drain. When the halo ion implantation region 314 is formed near both the source/drain regions 304a, 304b, respectively, as shown in FIG. 2, one bit of information for each of the charge storage oxide layers, which are interposed between the sidewall gate electrodes 310a, 310b and the semiconductor substrate 300, may be programmed, i.e., two bits of information may be programmed.

Further, the erase uses HHI as in the first embodiment of the present invention. For example, in the non-volatile memory device for erasing two bits per cell, negative voltages are applied to the main gate electrode 308 and the sidewall gate electrodes 310a, 310b at the same time, and positive voltages are applied to the source/drain regions 304a, 304b. A positive voltage may be sequentially applied to the source/drain regions 304a, 304b.

<Experimental Results>

In a non-volatile memory device having a charge storage oxide layer and a halo ion implantation region, program/erase and other characteristics are evaluated. The following experimental results were achieved using the non-volatile memory cell of the structure shown in FIG. 1A, herein "the present non-volatile memory device." The charge storage oxide layer is formed of an MTO layer, which is heat treated in the presence of $N_2O$.

Figure 3A:
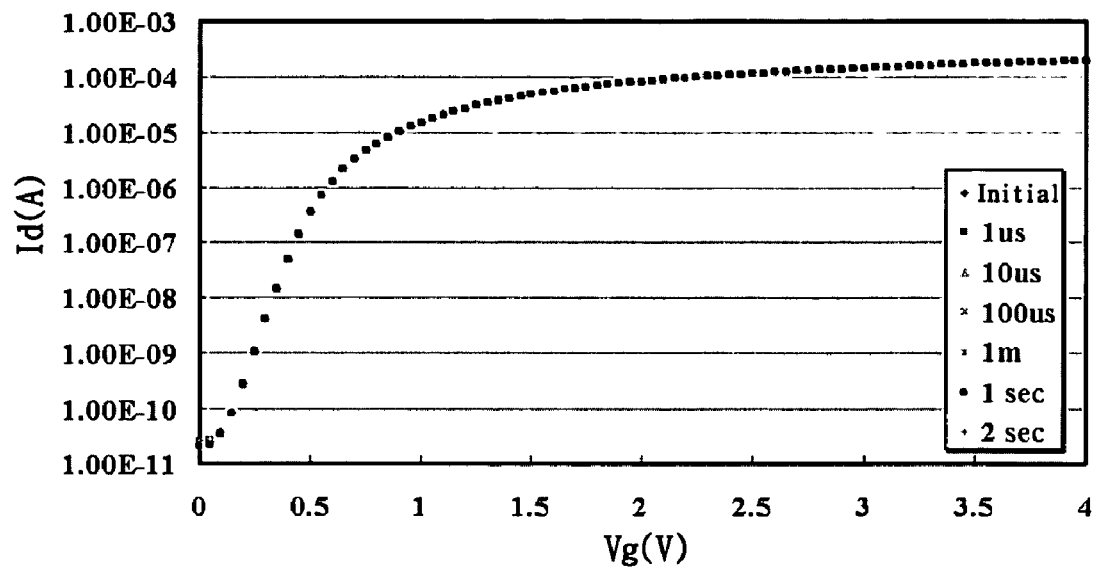
FIGS. 3A and 3B are graphs of current versus voltage (I-V) in accordance with program time of a non-volatile memory device without a halo ion implantation region, and a non-volatile memory device with a halo ion implantation region respectively.
Figure 3B:
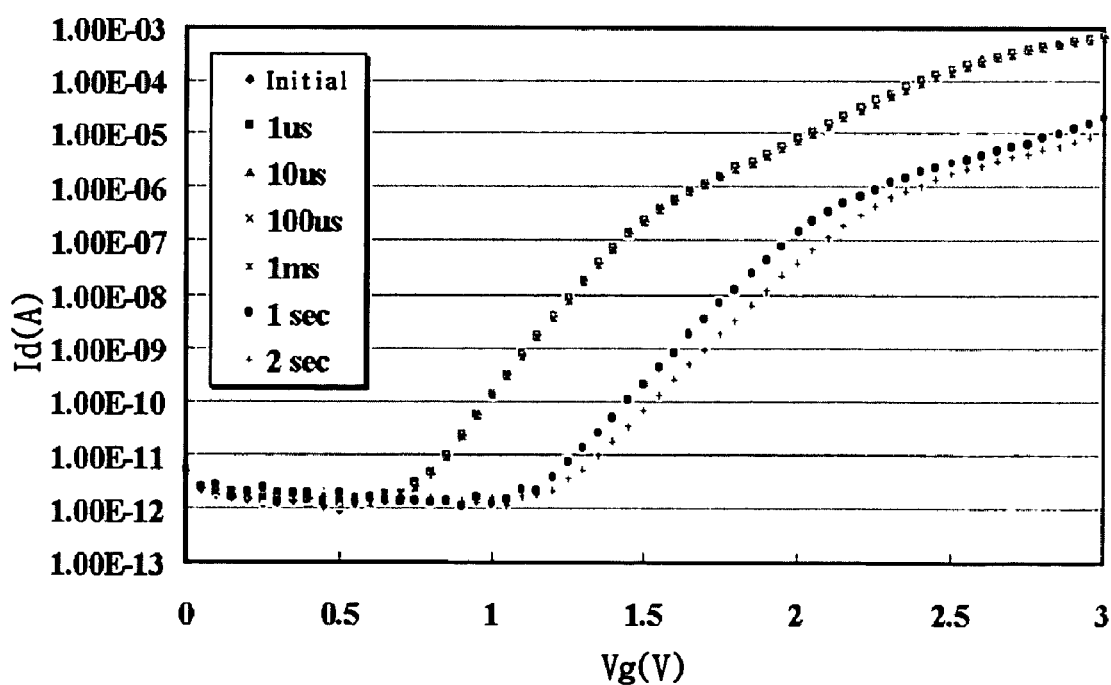

FIGS. 3A and 3B are graphs of current versus voltage (I-V) in accordance with program time of a non-volatile memory device without a halo ion implantation region, herein "the conventional non-volatile memory device," and the present non-volatile memory device, respectively. In FIGS. 3A and 3B, the abscissas indicate gate voltage ($V_g$) and the ordinates indicate drain current ($I_d$).

The results of FIGS. 3A and 3B have been achieved by applying 4 V, 4.5 V, and 1 V of voltages to a gate electrode, a drain and a source, respectively. A threshold voltage has been measured when 1 μA of current flows on the drain. As shown in FIG. 3A, the conventional non-volatile memory device has a threshold voltage which hardly varies with program time. In contrast, as shown in FIG. 3B, the present non-volatile memory device has a threshold voltage that increases with increased program time. Further, the result shown in FIG. 3B may be achieved by reading in a reverse direction, after programming. Therefore, FIG. 3B illustrates that program efficiency is increased using the present non-volatile memory device. Further, the result of FIG. 3B shows that programming of the present non-volatile memory device is possible even at a low gate voltage, e.g., about 5 V or less.

Figure 4:
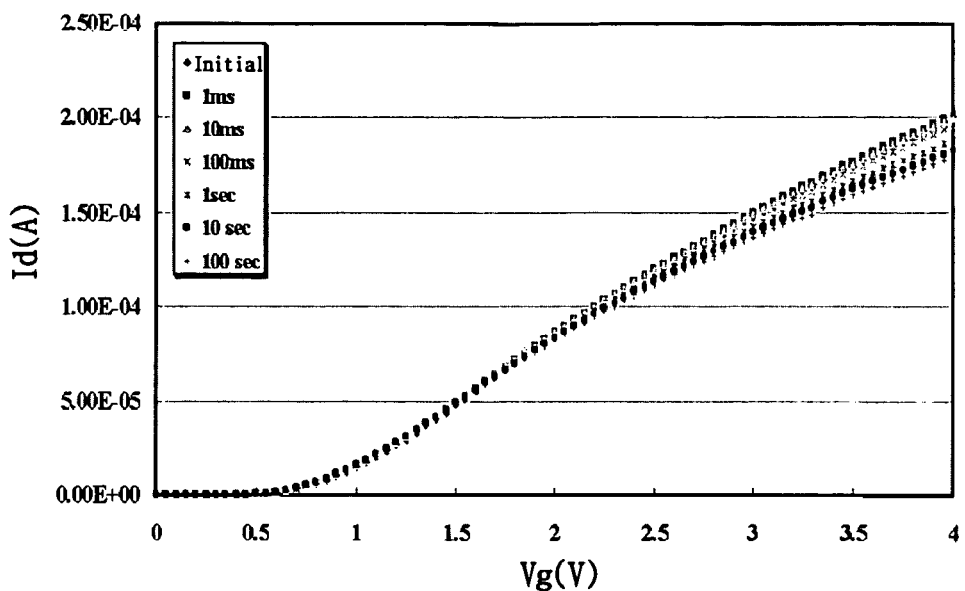
FIG. 4 is a graph of current versus voltage (I-V) in accordance with erase time of a non-volatile memory device without a halo ion implantation region.

FIG. 4 is a graph of current versus voltage (I-V) in accordance with erase time of the conventional non-volatile memory device. In FIG. 4, the abscissa indicates gate voltage ($V_g$) and the ordinate indicates drain current ($I_d$).

The result shown in FIG. 4 has been achieved by applying voltages of −4 V and 4 V to the gate electrode and the drain, respectively. The conventional non-volatile memory device shows that a threshold voltage hardly changes with respect to an increase in erase time as shown in FIG. 4, and when a gate voltage is equal to or above 2.5 V, current drivability is reduced.

Figure 5:
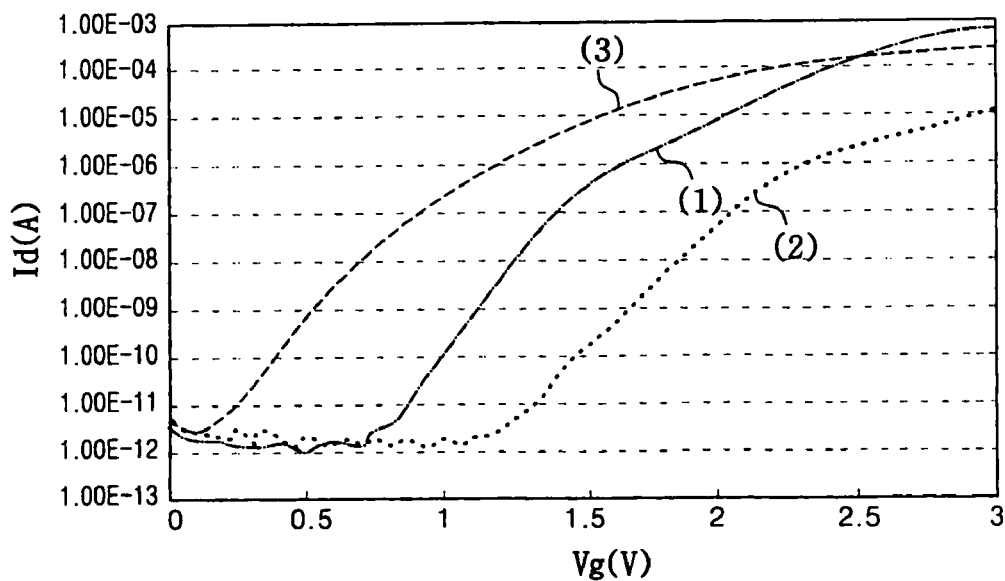
FIG. 5 is a graph illustrating a relationship between current and voltage (I-V) in before-program, after-program, and after-erase of a non-volatile memory device with a halo ion implantation region.

FIG. 5 is a graph illustrating relationships between current and voltage (I-V) in the case of before-program (1), after-program (2), and erase for one second (3) of the present non-volatile memory device. In FIG. 5, the abscissa indicates gate voltage ($V_g$) and the ordinate indicates drain current ($I_d$).

Unlike the conventional non-volatile memory device, the present non-volatile memory device, as shown in FIG. 5, shows a change of 1.25 V of voltage, from 2.45 V of program threshold voltage (drain current 1 μA) to 1.2 V of erase threshold voltage. Therefore, the halo ion implantation region improves program and erase efficiencies of a non-volatile memory device.

Figure 6:
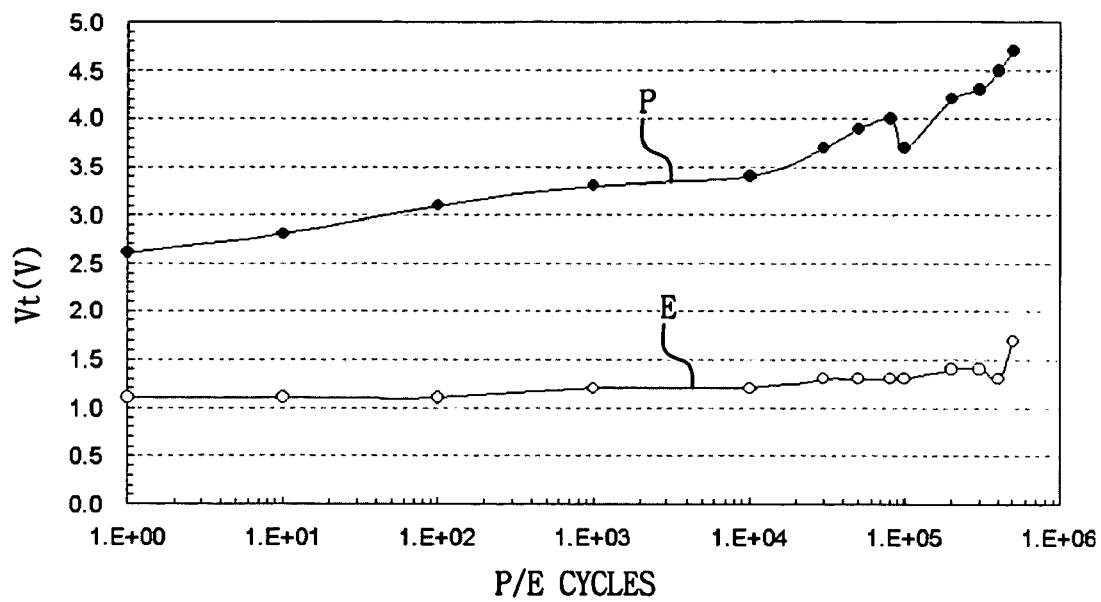
FIG. 6 is a graph illustrating endurance characteristics of a non-volatile memory device with a halo ion implantation region.

FIG. 6 is a graph of endurance characteristics of the present non-volatile memory device. In FIG. 6, the abscissa indicates number of program/erase (P/E) cycles and the ordinate indicates threshold voltage ($V_t$).

The program (P) is performed for 50 μs by applying voltages of 4 V, 5 V, and 1 V to the gate electrode, the drain and the source, respectively. The erase (E) is performed for 2 ms by applying voltages of −5.5 V and 5.5 V to the gate and the drain, respectively. As shown in FIG. 6, an initial threshold voltage window has been increased from about 1.5 V to about 3 V after 500,000 times of cycles. Further, at the end of the cycles, a reduction of a program threshold voltage or a significant increase of an erase threshold voltage is not present.

Figure 7:
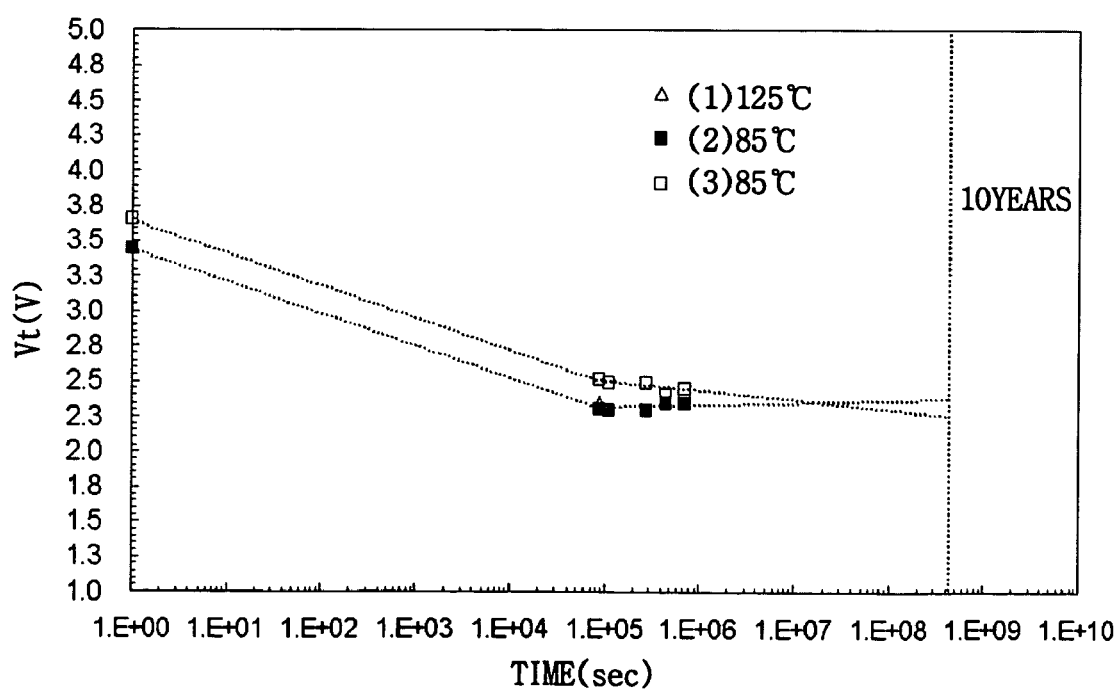
FIG. 7 is a graph illustrating bake retention characteristics of a non-volatile memory device with a halo ion implantation region.

FIG. 7 is a graph of bake retention characteristics of the present non-volatile memory device. A result (1) and a result (3) of FIG. 7 were achieved under the same initial threshold voltage and different bake temperatures, i.e., about 125° C. and 85° C., respectively. A result (2) and a result (3) of FIG. 7 have been achieved under the conditions of different initial threshold voltages and the same bake temperature, i.e., 85° C.

As can be seen in FIG. 7, when the initial threshold voltage is in a range of about 3.3 V to 3.8 V, and a bake temperature is about 85° C. and about 125° C., the threshold voltage is estimated to decrease to about 2.3 V after ten years. Thus, a stable non-volatile memory device having a halo implantation region may be realized if a read voltage is low, e.g., about 2 V or less.

As described above, according to the present invention, by using an oxide layer as a charge storage layer, a cell structure of a non-volatile memory device can be simplified. Thus, a fabrication process of the non-volatile memory device can be simplified, and productivity can be improved. Further, in the non-volatile memory device having the charge storage oxide layer, program and erase efficiencies can be further improved by forming a halo ion implantation region near one or both of the source/drain regions.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory device, comprising:
   a semiconductor substrate;
   a pair of source/drain regions in the semiconductor substrate;
   a channel region between the pair of source/drain regions;
   a charge storage oxide layer on the channel region, the charge storage oxide layer including solely oxygen-containing compounds, and directly overlapping and directly contacting a part of each of the pair of source/drain regions;
   a gate electrode disposed on the charge storage oxide layer; and
   at least one halo ion implantation region in the semiconductor substrate adjacent to one of the pair of source/drain regions, the halo ion implantation region being sandwiched between the respective one of the pair of source/drain regions and the channel region, the charge storage oxide layer directly overlapping the at least one halo ion implantation region.

2. The non-volatile memory device as claimed in claim 1, wherein the charge storage oxide layer is selected from the group consisting of a silicon oxide ($SiO_2$) layer, a silicon oxynitride (SiON) layer, an aluminum oxide ($Al_2O_3$) layer, a zirconium oxide ($ZrO_2$) layer, a hafnium oxide ($HfO_2$) layer, a lanthanum oxide ($La_2O_5$) layer, and a stacked layer thereof.

3. The non-volatile memory device as claimed in claim 1, wherein the charge storage oxide layer is a stacked layer of a thermal oxide layer and an MTO layer heat treated in a $N_2O$ atmosphere.

4. The non-volatile memory device as claimed in claim 1, wherein the charge storage oxide layer is a stacked layer of a thermal oxide layer, a silicon oxynitride layer, an MTO layer, a silicon oxynitride layer, and an MTO layer heat treated in a $N_2O$ atmosphere.

5. The non-volatile memory device as claimed in claim 1, wherein the pair of source/drain regions are of a first conductivity type and the halo ion implantation region is of a second conductivity type, the first and second conductivity types being different from each other.

6. The non-volatile memory device as claimed in claim 5, wherein the pair of source/drain regions are diffusion regions of N-type impurity ions, and the halo ion implantation region is a diffusion region of P-type impurity ions.

7. A method of operating the non-volatile memory device as claimed in claim 1, comprising:
   trapping electrons in the charge storage oxide layer located near the one of the pair of source/drain regions where the at least one halo ion implantation region is formed to program the non-volatile memory device; and
   injecting holes into the charge storage oxide layer located near the one of the pair of source/drain regions where the at least one halo ion implantation region is formed to erase the non-volatile memory device.

8. The method of operating the non-volatile memory device as claimed in claim 7, wherein the at least one halo ion implantation region includes a first and a second halo ion implantation region, each first and second halo ion implantation regions being in the semiconductor substrate adjacent to a respective one of the pair of source/drain regions and overlapping the charge storage oxide layer.

9. The method of operating the non-volatile memory device as claimed in claim 8, wherein two bits of information are programmed by trapping electrons in the charge storage oxide layer near each of the pair of source/drain regions, respectively.

10. The method of operating the non-volatile memory device as claimed in claim 8, wherein injecting holes comprises applying a negative voltage to the gate electrode and applying a positive voltage to each of the pair of source/drain regions, respectively.

11. A non-volatile memory device, comprising:
    a semiconductor substrate;
    a pair of source/drain regions in the semiconductor substrate;
    a channel region between the pair of source/drain regions;
    a main gate insulating layer and a main gate electrode, which are sequentially stacked on the channel region, and spaced apart from the pair of source/drain regions;
    sidewall gate electrodes disposed on both sidewalls of the main gate electrode to overlap a part of each of the pair of source/drain regions;
    a charge storage oxide layer continuously interposed between the main gate electrode and the sidewall gate electrodes, and between the sidewall gate electrodes and the semiconductor substrate; and
    at least one halo ion implantation region in the semiconductor substrate adjacent to one of the pair of source/drain regions, the charge storage oxide layer overlapping at least one halo ion implantation region.

12. The non-volatile memory device as claimed in claim 11, wherein the charge storage oxide layer is selected from the group consisting of a silicon oxide ($SiO_2$) layer, a silicon oxynitride (SiON) layer, an aluminum oxide ($Al_2O_3$) layer, a zirconium oxide ($ZrO_2$) layer, a hafnium oxide ($HfO_2$) layer, a lanthanum oxide ($La_2O_5$) layer, and a stacked layer thereof.

13. The non-volatile memory device as claimed in claim 11, wherein the charge storage oxide layer is a stacked layer of a thermal oxide layer and an MTO layer heat treated in a $N_2O$ atmosphere.

14. The non-volatile memory device as claimed in claim 11, wherein the charge storage oxide layer is a stacked layer of a thermal oxide layer, a silicon oxynitride layer, an MTO layer, a silicon oxynitride layer, and an MTO layer heat treated in a $N_2O$ atmosphere.

15. The non-volatile memory device as claimed in claim 11, wherein the source/drain regions are of a first conductivity type and the halo ion implantation region is of a second conductivity type, the first and second conductivity types being different from each other.

16. A method of operating the non-volatile memory device as claimed in claim 11, comprising:
    trapping electrons in the charge storage oxide layer located near the one of the pair of source/drain regions where the at least one halo ion implantation region is formed to program the non-volatile memory device; and
    injecting holes into the charge storage oxide layer located near the one of the pair of source/drain regions where the at least one halo ion implantation region is formed to erase the non-volatile memory device.

17. The method of operating the non-volatile memory device as claimed in claim 16, wherein the at least one halo ion implantation region includes a first and a second halo ion implantation region, each first and second halo ion implantation regions being in the semiconductor substrate adjacent to a respective one of the pair of source/drain regions and overlapping the charge storage oxide layer.

18. The method of operating the non-volatile memory device as claimed in claim 17, wherein two bits of information are programmed by trapping electrons in the charge storage oxide layer near each of the pair of source/drain regions, respectively.

19. The method of operating the non-volatile memory device as claimed in claim 17, wherein injecting holes comprises applying a negative voltage to the gate electrode and applying a positive voltage to each of the pair of source/drain regions, respectively.

20. A non-volatile memory device, comprising:
    a semiconductor substrate;
    a pair of source/drain regions in the semiconductor substrate;
    a channel region between the pair of source/drain regions;
    a charge storage oxide layer on the channel region, the charge storage oxide layer overlapping a part of each of the pair of source/drain regions;
    a gate electrode disposed on the charge storage oxide layer; and
    at least one halo ion implantation region in the semiconductor substrate adjacent to one of the pair of source/drain regions, the charge storage oxide layer directly overlapping at least one halo ion implantation region,
    wherein the charge storage oxide layer is a stacked layer of a thermal oxide layer, a silicon oxynitride layer, an MTO layer, a silicon oxynitride layer, and an MTO layer heat treated in a $N_2O$ atmosphere.

* * * * *